(12) United States Patent
Karavakis et al.

(10) Patent No.: US 9,706,667 B2
(45) Date of Patent: Jul. 11, 2017

(54) VIA IN A PRINTED CIRCUIT BOARD

(71) Applicant: SIERRA CIRCUITS, INC., Sunnyvale, CA (US)

(72) Inventors: Konstantine Karavakis, Pleasanton, CA (US); Kenneth S. Bahl, Saratoga, CA (US)

(73) Assignee: SIERRA CIRCUITS, INC., Sunnyvale, CA (US)

( * ) Notice: Subject to any disclaimer, the term of this patent is extended or adjusted under 35 U.S.C. 154(b) by 0 days.

(21) Appl. No.: 15/001,140

(22) Filed: Jan. 19, 2016

(65) Prior Publication Data

US 2016/0135297 A1    May 12, 2016

Related U.S. Application Data

(63) Continuation-in-part of application No. 14/281,802, filed on May 19, 2014, now Pat. No. 9,398,703.

(51) Int. Cl.
*H05K 1/09* (2006.01)
*H05K 3/38* (2006.01)
*H05K 3/42* (2006.01)

(52) U.S. Cl.
CPC ............ *H05K 3/387* (2013.01); *H05K 3/427* (2013.01); *H05K 2201/0221* (2013.01); *H05K 2201/0236* (2013.01); *H05K 2203/0709* (2013.01); *Y10T 29/49167* (2015.01)

(58) Field of Classification Search
CPC ... H05K 1/02; H05K 1/09; H05K 1/11; H05K 1/16; H05K 3/10; H05K 3/40; H05K 3/42; H05K 3/44; H05K 3/46; H01L 21/02; H01L 21/48; H01L 21/70; H01L 23/48

USPC .............. 174/257, 250, 262, 264–266; 1/1; 361/792; 257/701, 762, 767, 774; 29/828, 852

See application file for complete search history.

(56) References Cited

U.S. PATENT DOCUMENTS

| | | |
|---|---|---|
| 3,226,256 A | 12/1965 | Schneble, Jr. et al. |
| 3,259,559 A | 7/1966 | John et al. |
| 3,322,881 A | 5/1967 | Schneble et al. |
| 3,799,802 A | 3/1974 | Schneble et al. |
| 4,287,253 A | 9/1981 | Leech |
| 4,601,916 A * | 7/1986 | Arachtingi ............. C25D 13/00 204/479 |
| 4,861,643 A * | 8/1989 | Scollard ................... B64C 1/06 244/131 |
| 4,954,185 A | 9/1990 | Kohm |

(Continued)

FOREIGN PATENT DOCUMENTS

| | | |
|---|---|---|
| EP | 2120525 A1 | 9/2009 |
| GB | 1208337 A | 10/1970 |

(Continued)

OTHER PUBLICATIONS

PCT International Preliminary Report on Patentability for PCT Application PCT/US2015/014615, Dec. 1, 2016.

*Primary Examiner* — Xiaoliang Chen
(74) *Attorney, Agent, or Firm* — Douglas L Weller

(57) ABSTRACT

A via in a printed circuit board is composed of a patterned metal layer that extends through a hole in dielectric laminate material. A layer of catalytic adhesive coats walls within the hole. The patterned metal layer is placed over the catalytic adhesive within the hole.

12 Claims, 3 Drawing Sheets

(56) References Cited

U.S. PATENT DOCUMENTS

| | | | | |
|---|---|---|---|---|
| 4,980,005 | A * | 12/1990 | Scollard | B64C 1/06 156/330 |
| 5,162,144 | A | 11/1992 | Brown et al. | |
| 5,245,249 | A * | 9/1993 | Sakurai | H01J 31/126 313/313 |
| 5,252,383 | A * | 10/1993 | Fukutake | H01L 21/481 257/E23.007 |
| 5,309,632 | A | 5/1994 | Takahashi et al. | |
| 5,421,083 | A * | 6/1995 | Suppelsa | H05K 1/0222 174/250 |
| 5,814,889 | A * | 9/1998 | Gaul | H01L 21/763 257/750 |
| 5,949,030 | A * | 9/1999 | Fasano | H01L 21/486 174/262 |
| 6,605,551 | B2 * | 8/2003 | Wermer | H05K 1/115 257/763 |
| 6,812,065 | B1 * | 11/2004 | Kitamura | H01B 1/22 156/330 |
| 6,856,023 | B2 * | 2/2005 | Muta | H01L 21/76898 257/701 |
| 7,334,326 | B1 | 2/2008 | Huemoeller et al. | |
| 7,348,496 | B2 * | 3/2008 | Wermer | H05K 1/115 174/260 |
| 7,754,980 | B2 * | 7/2010 | Wang | H05K 1/0222 174/262 |
| 8,273,995 | B2 * | 9/2012 | Chandrasekraran | H01L 23/49827 174/262 |
| 9,125,304 | B2 * | 9/2015 | Wu | H05K 1/115 |
| 9,313,903 | B2 * | 4/2016 | Samejima | H05K 3/445 |
| 2002/0033275 | A1 * | 3/2002 | Sumi | H05K 1/095 174/262 |
| 2002/0195716 | A1 | 12/2002 | Magnusen et al. | |
| 2003/0151032 | A1 * | 8/2003 | Ito | C08K 9/02 252/570 |
| 2006/0055021 | A1 | 3/2006 | Yamamoto | |
| 2006/0057341 | A1 | 3/2006 | Kawabata et al. | |
| 2006/0068173 | A1 | 3/2006 | Kajiyama et al. | |
| 2009/0053459 | A1 * | 2/2009 | Hirose | H01L 23/49811 428/76 |
| 2009/0120660 | A1 | 5/2009 | Park et al. | |
| 2010/0266752 | A1 | 10/2010 | Tseng et al. | |
| 2011/0048783 | A1 | 3/2011 | Yu | |
| 2012/0022190 | A1 * | 1/2012 | Nagano | C08L 67/02 524/114 |
| 2012/0074094 | A1 | 3/2012 | Chiang et al. | |
| 2012/0168213 | A1 * | 7/2012 | Park | C09J 163/00 174/257 |
| 2013/0043062 | A1 | 2/2013 | Wismann | |
| 2013/0087825 | A1 * | 4/2013 | Umakoshi | H01L 33/60 257/99 |
| 2013/0160978 | A1 * | 6/2013 | Shin | F28F 21/084 165/133 |
| 2013/0168847 | A1 * | 7/2013 | Park | C08G 59/245 257/734 |
| 2014/0178635 | A1 * | 6/2014 | Imaizumi | B60J 1/007 428/138 |
| 2015/0102464 | A1 * | 4/2015 | Kang | H01L 28/75 257/535 |

FOREIGN PATENT DOCUMENTS

| | | |
|---|---|---|
| WO | WO 2009006010 A1 | 1/2009 |
| WO | WO 2012/127205 A1 | 9/2012 |
| WO | WO2014041057 A1 | 3/2014 |

* cited by examiner

VIA IN A PRINTED CIRCUIT BOARD

BACKGROUND

The miniaturization of the electronics industry has put pressure in the printed circuit board (PCB) industry to create features of fine circuitry. The print and etch processes often used to create PCB's and PCB cores are not precise enough for fine features down to one mil lines and spaces and below. Instead, additive processes using catalytic laminates allows copper (Cu) plating to be performed selectively in photolithographically defined channels and vias using plating resist.

The structure of a multilayer board can be created in many different ways. One way is that no-catalytic cores are made by print and etch to create the circuitry on both faces. The cores are stuck up and laminated followed by drilling and circuitization of the outer layers and the holes.

DESCRIPTION OF THE EMBODIMENT

In the fabrication of printed circuit boards (PCBs), where routing of metal is difficult because of high density requirements and where outer layers can be formed at the end of the fabrication processes, then a catalytic adhesive coating can be placed on walls of holes used for vias. The coating can be made using the same or similar material used to make the laminate of the PCB core. This allows for good adhesion of metal traces. Fabrication of the outer layers of the PCB can be done using lasers to create blind vias and a photoimage-able mask to create traces.

Figure 1:
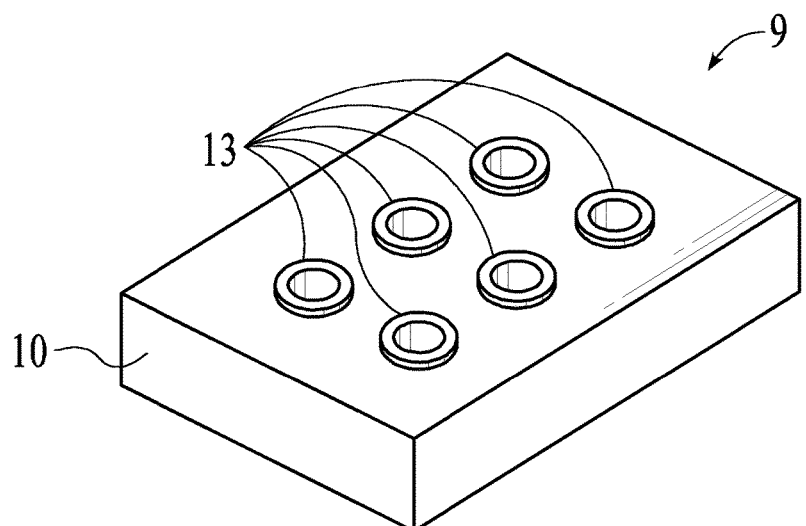
FIG. 1 shows a simplified diagram illustrated vias a printed circuit board in accordance with an implementation.

FIG. 1 illustrates vias in a portion of a printed circuit board (PCB) 9. Dielectric laminate material 10 functions as a PCB substrate (two-sided laminate core) and is composed of, for example, glass or non-glass reinforcement and a resin such as, for example, epoxy, polyimide, Teflon or any other type of resin suitable for inclusion in a PCB substrate. Dielectric laminate material 10 is, for example, approximately 0.028" thick. Vias 13, for example, composed of a metal such as copper, silver, gold or some other suitable conductive metal extend through dielectric laminate material 10 allowing electrical connection between circuitry on different faces of PCB 9.

Figure 2:
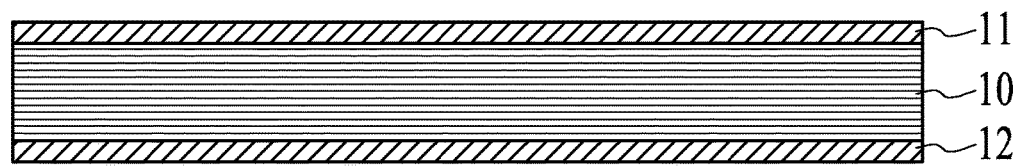
FIG. 2, FIG. 3, FIG. 4, FIG. 5, FIG. 6 and FIG. 7 illustrate steps in a process where vias are formed in a printed circuit board in accordance with an implementation.

A process for forming the vias is illustrated in FIGS. 2 through 7. Dielectric laminate material 10 is shown in FIG. 2. Dielectric laminate has a metal top coating 11 and a metal bottom coating 12. For example, metal top coating 11 and metal bottom coating 12 are composed of a metal such as copper, silver, gold or some other suitable conductive metal. For example, metal top coating 11 and metal bottom coating 12 each has a thickness between 0.1 microns and 5 microns. Metal top coating 11 and metal bottom coating 12 can be applied to dielectric laminate material 10 with any known process such as sputtering, lamination, etc.

Figure 3:
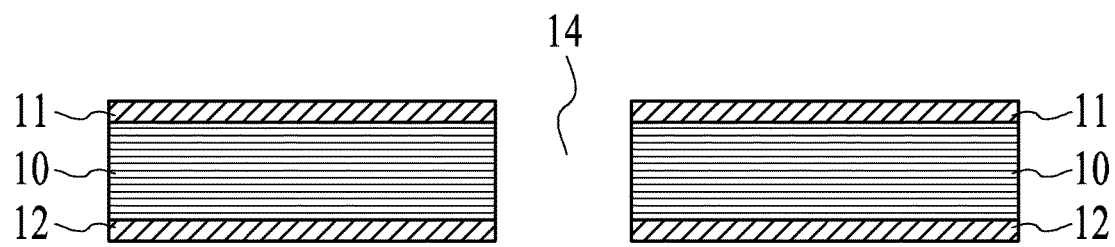

As illustrated by FIG. 3, for each via, a hole 14 is drilled in dielectric laminate material 10. Hole 14 is, for example, approximately 8 mil in diameter. The diameter of via holes will vary depending on application, available manufacturing processes and so on.

Figure 4:
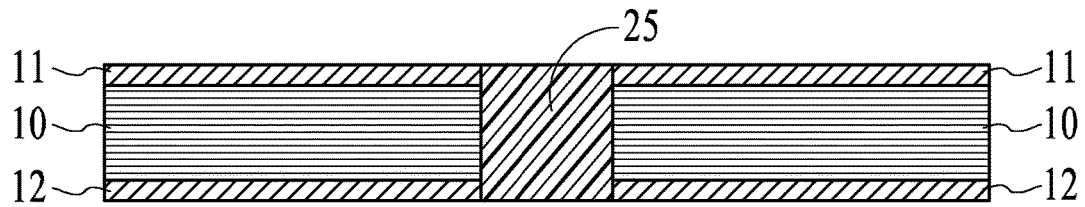

Hole 14 is filled with a catalytic adhesive material 25, as shown in FIG. 4. For example, catalytic adhesive material 25 is a dielectric adhesive such as an epoxy, polyimide, cyanate ester or another suitable dielectric adhesive. The dielectric adhesive includes, for example, both non-catalytic and catalytic filler particles. The catalytic filler particles are composed of, for example, a metal such as palladium (Pd), iron (Fe) and/or other catalytic particles used for copper plating where electroless copper (Cu) is reduced from its $Cu^{++}$ to Cu. For example, the catalytic particles can be made of inorganic filler with metal coated over the inorganic filler. For example, the inorganic filler can be silicon dioxide, kaolin, or some other inorganic filler with suitable properties for the particular application.

To create the plug, the adhesive material can be topically applied to hole 14. Alternatively, an adhesive layer can be deposited on one or both sides of laminate material. After depositing the adhesive layer, any excess adhesive material residing metal coating 11 or metal coating 12 is removed. This is done before the adhesive layer is cured. The removal can be accomplished, for example, by a squeeze process, a wipe process, or any other process that cleans the adhesive layer from metal coating 11 and metal coating 12.

The reology (viscosity) of the adhesive is adjusted and is based on the type of method used to fill the holes. The dielectric material contains catalytic particles that, for example, have a particle size in the range of 2 to 12 micrometer (um). Alternatively, other particle sizes can be used. For example, smaller particle sizes are better as bigger particle size may affect uniformity and roughness of copper plating placed on top adhesive layer 11 and bottom adhesive layer 12. For example, by weight the particles are between six and fifteen percent of the total weight of the catalytic adhesive material 25. This percentage is only an example as for various applications the weight of the particles may be some other percentage of the total weight of the catalytic adhesive material 25. The catalytic adhesive material is deposited using, for example, screen printing, stenciling, or squeegee coating using a coating machine such as those available from the ITC, Intercircuit, N.A., or another coating device able to perform or one or more of the known processes and techniques in the industry used to deposit material on a PCB substrate.

Figure 5:
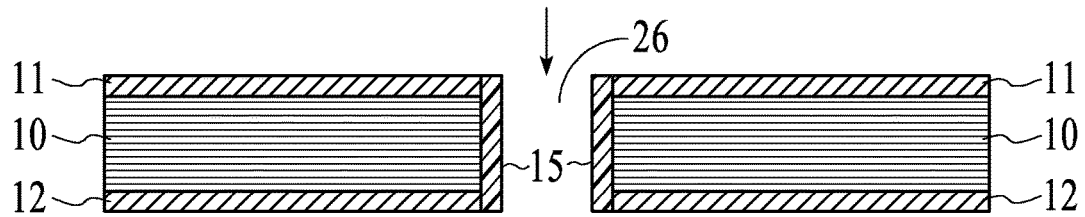

FIG. 5 illustrates a hole 26 drilled through catalytic adhesive material 25. For example, hole 26 is 6 mil in diameter, leaving a layer 15 of catalytic adhesive material around the diameter of hole 26. The diameter of hole 26 will vary depending on application, available manufacturing processes and so on. Catalytic particles in the holes are exposed when the hole is drilled. In addition, catalytic particles can be additionally exposed by using plasma, or any other PCB board techniques such as chemical desmear, etc., to remove some of the resin of the catalytic adhesive material.

Figure 6:
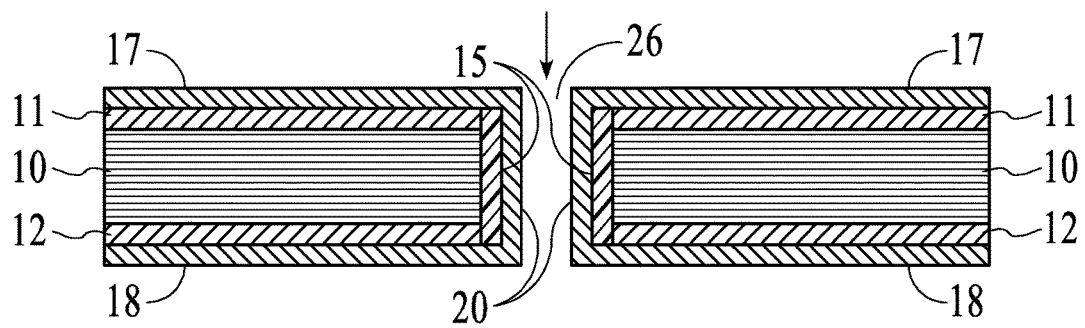

FIG. 6 shows a full metal plating layer 17 having been deposited over metal coating 11 and a full metal plating layer 18 having been deposited over metal coating 12. Metal regions 20 are also formed within hole 26. For example the thickness of metal plating layer 17, metal plating layer 18 and metal regions 20 is between 0.5-1.4 mils. For example, full metal plating layer 17, full metal plating layer 18 and metal regions 20 are composed of electroless or electroplated copper or some other suitable conductive material.

Figure 7:
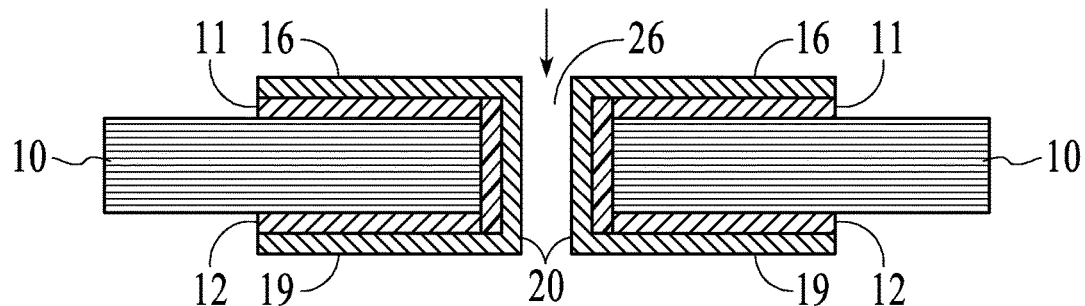

To pattern the metal layers, resist is applied and exposed to develop pattern plating. The resist is then removed and the metal is etched. The result, shown in FIG. 7, is a patterned metal layer 16 and a patterned metal layer 19. Metal coating 11 remains under metal patterned layer 16 and metal coating 12 remains under metal patterned layer 19. The catalytic adhesive material around the diameter of hole 26 assures good adhesion of metal regions 20 within hole 26.

Metal patterned layer 16 and metal patterned layer 19 function as traces for the PCB.

Using a resist pattern to form copper plating allows for better defined traces (i.e. traces with straighter wall formation) which helps in better trace electrical characteristics such as impedance and line signal loss. When copper traces are formed, for example, using a subtractive print and etch process, the cross section of the traces looks like a trapezoid rather than a square or rectangle as they appear when formed using resist.

Once the two-sided laminate core is circuitized, multilayer constructions can be made using known techniques such as applying additional catalytic adhesive over the circuitized layers and forming vias by laser or plasma to build additional layer(s).

For example, to add an additional layer on a circuitized two-sided laminate core, both faces of the circuitized laminate core are coated with catalytic adhesive. The coating covers holes in the laminate core, such as hole 27 shown in FIG. 6. The catalytic adhesive functions as a dielectric layer separating the layers that are going to be built on top. The catalytic adhesive layer is fully cured by heat or UV energy. A thin (e.g., 0.1 to 5 microns) coating of copper (Cu) is applied over the catalytic adhesive layer on both sides of the laminate core. The subsequent steps of constructing the next outer layers include via formation, for example, using a laser for blind stack vias or mechanical drilling for connection between layers. If mechanical drilling is required this is done, for example, by drilling a hole, filling the hole with catalytic adhesives and then drilling a second hole. If the interconnection between layers is performed with laser blind vias, then no drilling is necessary. The vias go through copper metallization followed by dry film and selective copper plating. The resist is then stripped and the thin Cu is etched to create the traces. The same process is repeated for additional layers on both sides.

Figure 8:
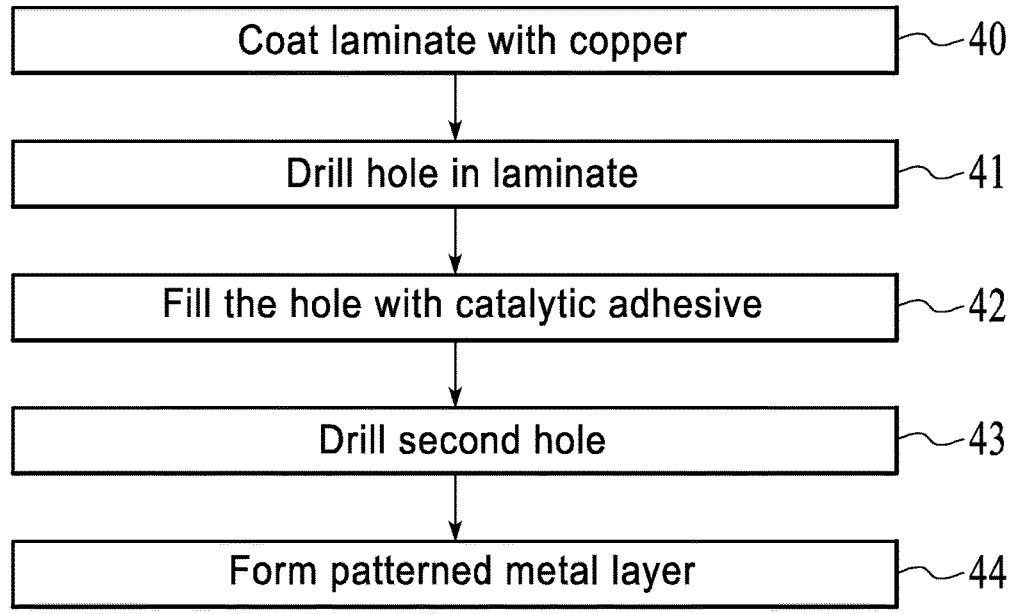
FIG. 8 is a flowchart summarizing a process where vias are formed in a printed circuit board in accordance with an implementation.

FIG. 8 summarizes the overall implementation of using catalytic adhesive as illustrated in FIGS. 2 through 7. In a block 40, both faces of dielectric laminate material are coated with a metal, such as copper. In a block 41, a hole is drilled in dielectric laminate material. In a block 42, the hole is filled with a catalytic adhesive. In a block 43, a second hole is drilled through the catalytic adhesive where the catalytic adhesive fills the first hole. The second hole has a smaller diameter than the first hole so that a layer of catalytic adhesive remains at a diameter of the second hole. This process may be repeated for additional layers. As pointed out above, for layers where mechanical drilling is not necessary to form layers to connect vias, block 41, block 42 and block 43 are omitted.

In a block 44, a patterned metal layer is formed over the metal coatings on both faces of the dielectric laminate material.

Figure 9:
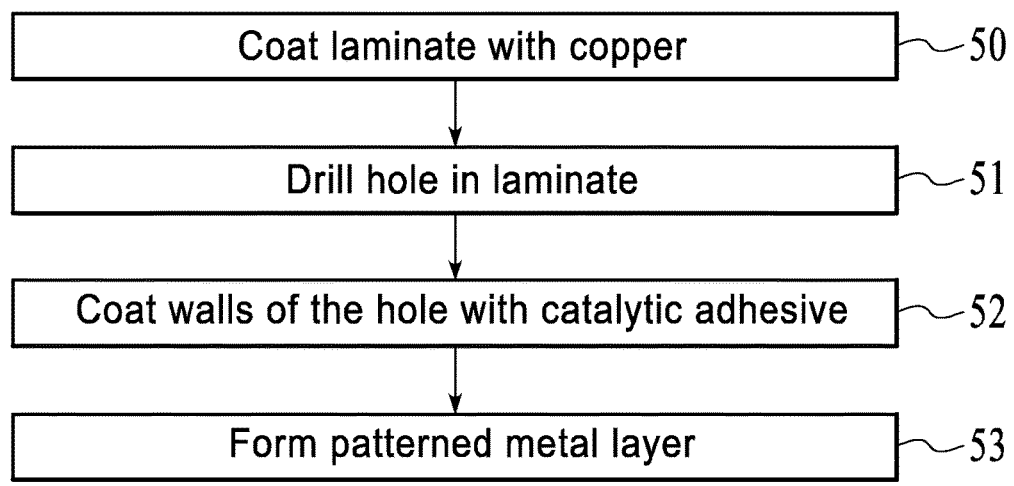
FIG. 9 is a flowchart summarizing a process where vias are formed in a printed circuit board in accordance with an alternative implementation.

FIG. 9 summarizes an alternative implementation. In a block 50, both faces of dielectric laminate material are coated with a metal such as copper. In a block 51, a hole is drilled in dielectric laminate material. In a block 52, walls of the hole are coated catalytic adhesive. For example, to do this one or both faces of the dielectric laminate material are coated with a catalytic adhesive when the hole walls are coated. For example, electrostatic spraying, spraying or some other coating process is performed, for example, using standard coating equipment in the industry, to coat the dielectric laminate material with the catalytic adhesive so that the walls of the hole is coated at the same time. For example, thickness of the catalytic adhesive coat is five to fifty microns. The viscosity of the adhesive is adjusted depending on the method of application. The catalytic adhesive coating is removed from the metal surfaces before being cured. This is done, for example, by squeezing, wiping, etc. The catalytic adhesive remaining on the walls of the hole is then cured.

In a block 53, a patterned metal layer is formed over the metal coatings on both faces of the dielectric laminate material.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A method for forming a via in a printed circuit board, comprising:
   coating both faces of dielectric laminate material with a metal coating;
   drilling a first hole in dielectric laminate material;
   coating walls of the first hole with a catalytic adhesive, the catalytic adhesive including catalytic filler particles composed of one or a combination of the following: palladium; iron; an inorganic filler coated with a metal;
   forming a patterned metal layer over the metal coating on both faces of the dielectric laminate material, including placing the patterned metal layer over the coating of catalytic adhesive on walls of the hole; and
   removing any catalytic adhesive on the metal coating before curing the catalytic adhesive.

2. A method as in claim 1 wherein the catalytic adhesive is a dielectric adhesive that includes non-catalytic in addition to the catalytic filler particles.

3. A method as in claim 1 wherein the catalytic adhesive is a dielectric adhesive and the catalytic filler particles are composed of metal suitable as a catalyst for copper plating.

4. A method as in claim 1 wherein the patterned metal layer is composed of copper.

5. A method as in claim 1 wherein the catalytic filler particles are composed of palladium.

6. A method for forming a via in a printed circuit board, comprising:
   coating both faces of dielectric laminate material with a metal coating;
   drilling a first hole in dielectric laminate material;
   coating walls of the first hole with a catalytic adhesive, the catalytic adhesive including catalytic filler particles composed of one or a combination of the following: palladium; iron; an inorganic filler coated with a metal; and
   forming a patterned metal layer over the metal coating on both faces of the dielectric laminate material, including placing the patterned metal layer over the coating of catalytic adhesive on walls of the hole;

wherein the catalytic adhesive is a dielectric adhesive and the catalytic filler particles are composed of inorganic filler with metal coated over the inorganic filler.

7. A method for forming a via in a printed circuit board, comprising:
   coating both faces of dielectric laminate material with a metal coating;
   drilling a first hole in dielectric laminate material;
   coating walls of the first hole with a catalytic adhesive, the catalytic adhesive including catalytic filler particles composed of one or a combination of the following: palladium; iron; an inorganic filler coated with a metal; and,
   forming a patterned metal layer over the metal coating on both faces of the dielectric laminate material, including placing the patterned metal layer over the coating of catalytic adhesive on walls of the hole;
   wherein coating walls of the first hole with a catalytic adhesive includes the following:
      filling the first hole with the catalytic adhesive;
      drilling a second hole through the catalytic adhesive where the catalytic adhesive fills the first hole, the second hole having a smaller diameter than the first hole so that a layer of catalytic adhesive remains on walls of the second hole.

8. A method as in claim 7, additionally comprising:
   removing catalytic adhesive that remains on the metal coating on both faces of the dielectric laminate material after filing the first hole, the removing being performed before curing the catalytic adhesive.

9. A method as in claim 7 wherein the catalytic adhesive is a dielectric adhesive that includes non-catalytic in addition to the catalytic filler particles.

10. A method as in claim 7 wherein the catalytic adhesive is a dielectric adhesive and the catalytic filler particles are composed of metal suitable as a catalyst for copper plating.

11. A method as in claim 7 wherein the catalytic adhesive is a dielectric adhesive and the catalytic filler particles are composed of inorganic filler with metal coated over the inorganic filler.

12. A method as in claim 7 wherein the patterned metal layer is composed of copper.

* * * * *